United States Patent
Deak

(10) Patent No.: US 9,654,136 B1
(45) Date of Patent: May 16, 2017

(54) SEGMENTED RESISTOR DIGITAL-TO-ANALOG CONVERTER WITH RESISTOR RECYCLING

(71) Applicant: QUALCOMM Incorporated, San Diego, CA (US)

(72) Inventor: Edward Robert Deak, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/154,620

(22) Filed: May 13, 2016

Related U.S. Application Data

(60) Provisional application No. 62/294,259, filed on Feb. 11, 2016.

(51) Int. Cl.
 *H03M 1/66* (2006.01)
 *H03M 1/78* (2006.01)
 *H03M 1/68* (2006.01)

(52) U.S. Cl.
 CPC ........... *H03M 1/785* (2013.01); *H03M 1/687* (2013.01)

(58) Field of Classification Search
 CPC ............................. H03M 1/687; H03M 1/785
 USPC ........................................ 341/154, 144, 145
 See application file for complete search history.

(56) References Cited

U.S. PATENT DOCUMENTS

| | | | |
|---|---|---|---|
| 5,808,576 A | 9/1998 | Chloupek et al. | |
| 5,859,606 A | 1/1999 | Schrader et al. | |
| 6,246,351 B1 | 6/2001 | Yilmaz | |
| 6,617,989 B2 | 9/2003 | Deak | |
| 7,532,140 B1 | 5/2009 | Rempfer et al. | |
| 8,188,899 B2 | 5/2012 | Motamed | |
| 8,242,944 B2* | 8/2012 | Umeda | G09G 3/3688 341/144 |
| 8,552,898 B2 | 10/2013 | Le et al. | |
| 2004/0212526 A1* | 10/2004 | Mallinson | H03M 1/0604 341/145 |
| 2009/0085787 A1* | 4/2009 | Anthony | G11C 7/02 341/145 |
| 2011/0006939 A1* | 1/2011 | Hirai | H03M 1/682 341/145 |
| 2012/0139769 A1* | 6/2012 | Hirai | H03M 1/682 341/145 |

\* cited by examiner

*Primary Examiner* — Peguy Jean Pierre
(74) *Attorney, Agent, or Firm* — Rupit M. Patel

(57) ABSTRACT

Embodiments relate to an improved segmented resistor digital-to-analog converter (DAC) with resistor recycling. An input digital code word is segmented into M most-significant-bits (MSBs) and N least-significant-bits (LSBs). The DAC includes a MSB resistor ladder coupled with a first set of switches and a LSB resistor ladder coupled with a second set of switches. Based on the decoded bit pattern of the LSBs, embodiments are operable to either switch one or more LSB resistors from the bottom of the MSB resistor ladder up to the top, or to switch the LSB resistors from the top of the MSB resistor ladder down to the bottom. In at least one example embodiment, this technique can avoid redundant resistors in the circuit, which can solve mismatch problems due to redundant resistors in the circuit as in prior art solutions, which can lead to problems relating to non-linearity and non-monotonicity.

23 Claims, 12 Drawing Sheets

SEGMENTED RESISTOR DIGITAL-TO-ANALOG CONVERTER WITH RESISTOR RECYCLING

CROSS-REFERENCE TO RELATED APPLICATION

Pursuant to 35 U.S.C. §119(e), this application is entitled to and claims the benefit of the filing date of U.S. Provisional App. No. 62/294,259 filed Feb. 11, 2016, the content of which is incorporated herein by reference in its entirety for all purposes.

FIELD OF THE INVENTION

At least certain embodiments disclosed herein relate generally to digital-to-analog converter ("DAC") technology, and more particularly, to an improved segmented resistor DAC configuration.

BACKGROUND

Digital-to-analog converters ("DACs") are circuits configured to convert digital code words at the input into analog voltages at the output. A digital code word consists of a number N of binary bits ($b_1, b_2 \ldots b_N$). The analog voltage output from the DAC corresponds to a particular binary scaling of a reference voltage $V_{REF}$, where the binary scaling is related to the digital code word. The minimum step size for the analog output voltage between adjacent code words corresponds to $V_{REF}/2^N$, where N is the number of binary bits in the digital code word.

A resistor ladder works as a large voltage divider with its nodes having incrementally increasing voltage values. A switch matrix selects one or more of the nodes of the resistor ladder to be coupled with the output node of the DAC based on the value of the input digital code word. A resistor ladder DAC (also referred to as resistor string DAC) is a type of DAC that includes a plurality of resistors connected in series between a high reference voltage and a low reference voltage. One or more of the nodes connecting the resistors of the resistor ladder can be selectively coupled with an output node of the DAC in response to the different values of the digital code word at the input. For each unique value of the input digital code word, different ones of the nodes of the resistor ladder are coupled with the output node.

A segmented resistor DAC comprises a DAC that is implemented with both resistor ladders and segmentation where higher-order bits (referred to as most-significant-bits ("MSBs")) of the input digital code word can be decoded separately from the lower-order bits (referred to as least-significant bits ("LSBs")). This is done to effectively reduce the amount of resistors needed to generate the output analog voltage values. Previous segmented resistor DAC solutions implemented using resistor ladders are configured to switch resistors in or out of the resistive path based on bit decoding of the input digital code word. This has a number of disadvantages.

First, only a fraction of the resistors in the resistor ladder is utilized for each combination of input bit patterns, while the other resistors are switched out of the resistive path, and are therefore redundant. This results in a significant amount unused resistors and wasted device die area. Further, because conventional solutions utilize different numbers and configurations of resistors for the various different input bit patterns, mismatches often occur in the circuit leading to problems of non-linearity and non-monotonicity.

SUMMARY

The embodiments described in this disclosure relate to an improved segmented resistor DAC circuit configuration with resistor recycling.

The following detailed description and accompanying drawings provide a better understanding of the nature and advantages of the present disclosure.

BRIEF DESCRIPTION OF THE DRAWINGS

For a better understanding of at least certain embodiments, reference will be made to the following detailed description, which is to be read in conjunction with the accompanying drawings.

DETAILED DESCRIPTION

Figure 1:
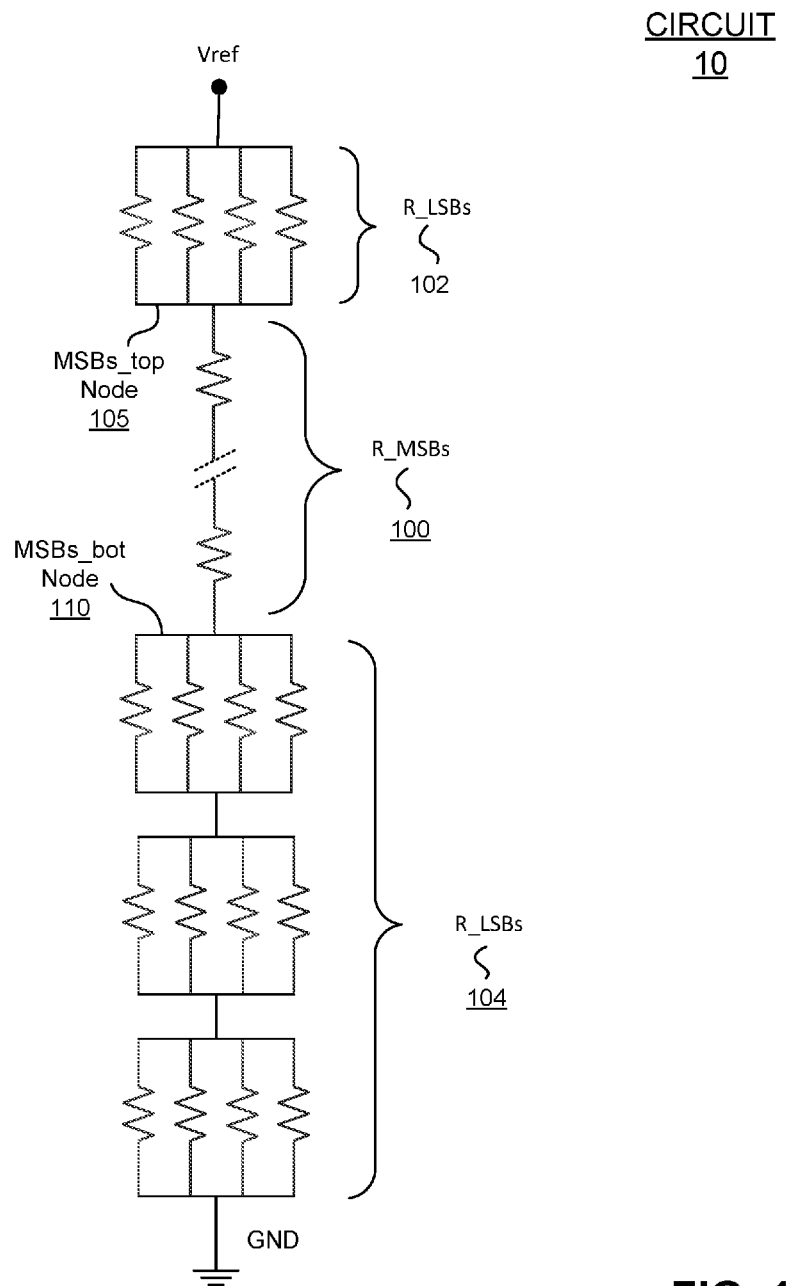
FIGS. 1-2 depict conceptual block diagrams of an example embodiment of a segmented resistor DAC that utilizes resistor recycling in accordance with the techniques described in this disclosure.

Throughout the description, for the purposes of explanation, numerous specific details are set forth in order to provide a thorough understanding of the present disclosure. It will be apparent to one skilled in the art, however, that the techniques described in this disclosure may be practiced without some of these specific details. In other instances, well-known structures and devices may be shown in block diagram form to avoid obscuring the underlying principles of the disclosure.

Provided below is a description of an example circuit configuration upon which the embodiments described in this disclosure may be implemented. Although certain elements may be depicted as separate components, in some instances one or more of the components may be combined into a single element. Likewise, although certain functionality may be described as being performed by a single element or component, the functionality may in some instances be performed by multiple components or elements working together in a functionally coordinated manner.

For the purposes of the present disclosure, the term "resistor ladder" refers to an electrical circuit made of repeating units of resistive elements. It should be noted that, although this disclosure is described in terms of "resistors", "resistor ladders" and "resistor strings", the embodiments are not limited to any particular type or configuration of resistor or resistive element. A "resistor" as used in this disclosure may refer to an electrical element capable of implementing an electrical resistance to current flow in a circuit. Resistors may include, for example, metal resistors, polysilicon resistors, source-drain resistors, triode-based MOSFET resistors, etc.

The techniques described in this disclosure relate to an improved segmented resistor DAC circuit configuration adapted to solve the aforementioned shortcomings of previous segmented resistor DAC solutions. In at least certain embodiments, embodiments of the segmented resistor DAC comprise a first resistor ladder corresponding to a first set of bits of the input digital code word (e.g., MSBs) and a second resistor ladder corresponding to a second set of bits of the input digital code word (e.g., LSBs). The first resistor ladder may be referred to as the "MSB resistor ladder" because it can be configured to receive the MSBs of the digital code word as inputs, and the second resistor ladder may be referred to as the "LSB resistor ladder" because it can be configured to receive the LSBs of the digital code word as inputs.

At the outset it should be noted that the embodiments described in this disclosure are not limited to any particular segmentation of the bits of the input digital code word between the first set of bits (e.g., MSBs) and the second set of bits (e.g., LSBs). There is no limitation as to how the sets of bits can be segmented between MSBs and LSBs. The particular segmentation chosen between MSBs and LSBs is a design choice that may be based on the particular implementation of the segmented resistor DAC, as well as other design considerations. For example, a 4-bit input digital code word can be segmented into 1MSB/3LSBs, 2MSBs/2LSBs, or 3MSBs/1LSB. The same is true for any number of bits in the input digital code word.

At least certain embodiments described in this disclosure may be operable to switch certain of the LSB resistors in the LSB resistor ladder into positions either above or below the MSB resistors in the MSB resistor ladder based on the value of the LSBs of the input digital code word. Correspondingly, the output node of the segmented resistor DAC, which is coupled with nodes of the MSB resistor ladder, may be incrementally shifted up to higher voltage levels or down to lower voltage levels depending on the value of the LSBs of the input digital code word. That is, based on the value of the LSBs of the input digital code word, the corresponding analog voltage level at the output node of the segmented resistor DAC can be incrementally shifted up to higher voltage levels or down to lower voltage levels depending on the number of LSB resistors in the LSB resistor ladder that are selectively switched above the MSB resistor ladder in the circuit as compared with the number of LSB resistors in the LSB resistor ladder selectively switched below the MSB resistor ladder in the circuit.

More particularly, certain embodiments may be operable to selectively switch a first set of the LSB resistors in the LSB resistor ladder into the resistive path above the top node of the MSB resistor ladder (between the top node of the MSB resistor ladder and a high reference voltage level "$V_{REF}$" for the circuit), and to selectively switch a second set of remaining LSB resistors in the LSB resistor ladder into the resistive path below the bottom node of the MSB resistor ladder (between the bottom node and a low reference voltage level "GND" for the circuit). Or, vice versa, certain embodiments may be operable to selectively switch the first set of the LSB resistors into the resistive path below the bottom node of the MSB resistor ladder and to selectively switch the second set of remaining LSB resistors into the resistive path above the top node of the MSB resistor ladder based on the value of the LSBs. In one embodiment, the reference voltage $V_{REF}$ may be the supply voltage.

The LSBs may be selectively switched based on the value of the LSBs of the input digital code word. In one embodiment, all of the LSB resistors in the LSB resistor ladder may be switched either above the top node or below the bottom node of the MSB resistor ladder.

In at least one example embodiment, the resistors of the LSB resistor ladder may be utilized for the possible combinations of decoded bit patterns of the input digital code word without having any redundant resistors. Such resistor reuse is referred to in this disclosure as "resistor recycling". This technique of resistor recycling avoids unused resistors and solves the mismatch problems of the prior art discussed that arise due to fluctuations in current resulting from the changing bit patterns of the digital code word at the input of the circuit. Conceptual block diagrams illustrating this technique are shown in FIGS. 1-2 described below.

Figure 2:
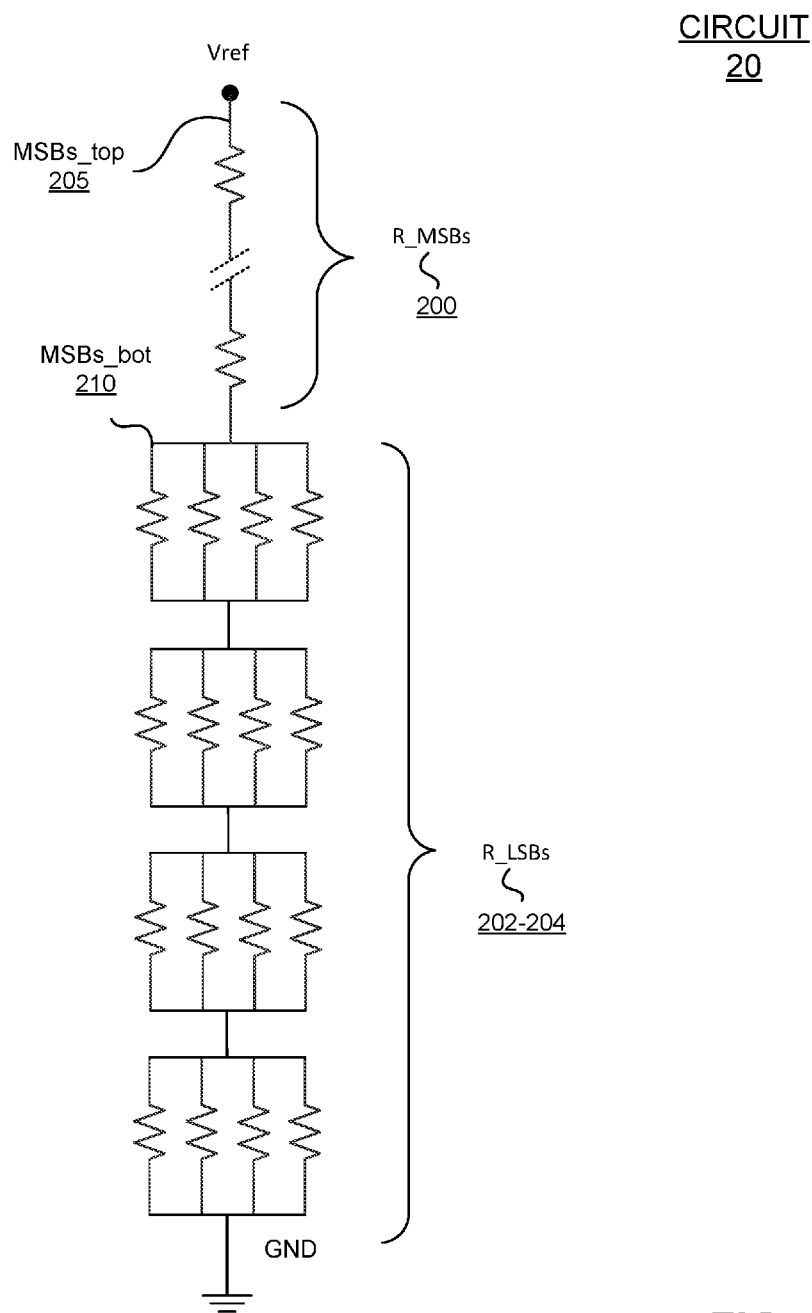

FIG. 1 depicts a conceptual block diagrams of an embodiment of a segmented resistor DAC that utilizes resistor recycling in accordance with the techniques described in this disclosure. In the illustrated embodiment of FIG. 1, circuit 10 includes a MSB resistor ladder comprising MSB resistors R_MSBs 100 connected in series between a top node 105 and a bottom node 110 of the MSB resistor ladder, and a LSB resistor ladder comprising LSB resistors R_LSBs 102 and 104. As shown, a portion of the LSB resistors R_LSBs 102 of the LSB resistor ladder can be selectively switched into the resistive path above the top node 105 of the MSB resistor ladder between the top node 105 and the high reference voltage $V_{REF}$ for the circuit, and a portion of the LSB resistors R_LSBs 104 of the LSB resistor ladder can be selectively switched into the resistive path below the bottom node 110 of the MSB resistor ladder between the bottom node 110 and GND. But any combination of the LSB resistors R_LSBs 202-204 can be selectively switched into either the resistive path above the top node 205 of the MSB resistor ladder or into the resistive path below the bottom node of the MSB resistor ladder.

For example, in the embodiment depicted in FIG. 2, all the LSB resistors R_LSBs 202-204 have been selectively switched into the resistive path below the bottom node 210 of the MSB resistor ladder 200 and the top node 205 of the MSB ladder is shifted to its highest voltage level, in this case equal to $V_{REF}$. In this manner, the techniques described in this disclosure are operable to implement an improved segmented resistor DAC with resistor recycling such that the resistors used in the LSB resistor ladder can be utilized in different combinations corresponding to the possible values of the input digital code word to provide the appropriate analog output voltage level at the output node of the DAC. The resistors R_LSBs 202-204 in the LSB resistor ladder may therefore be utilized for the various combinations of bit patterns of the input digital code word without any redundant resistors.

Figure 3:
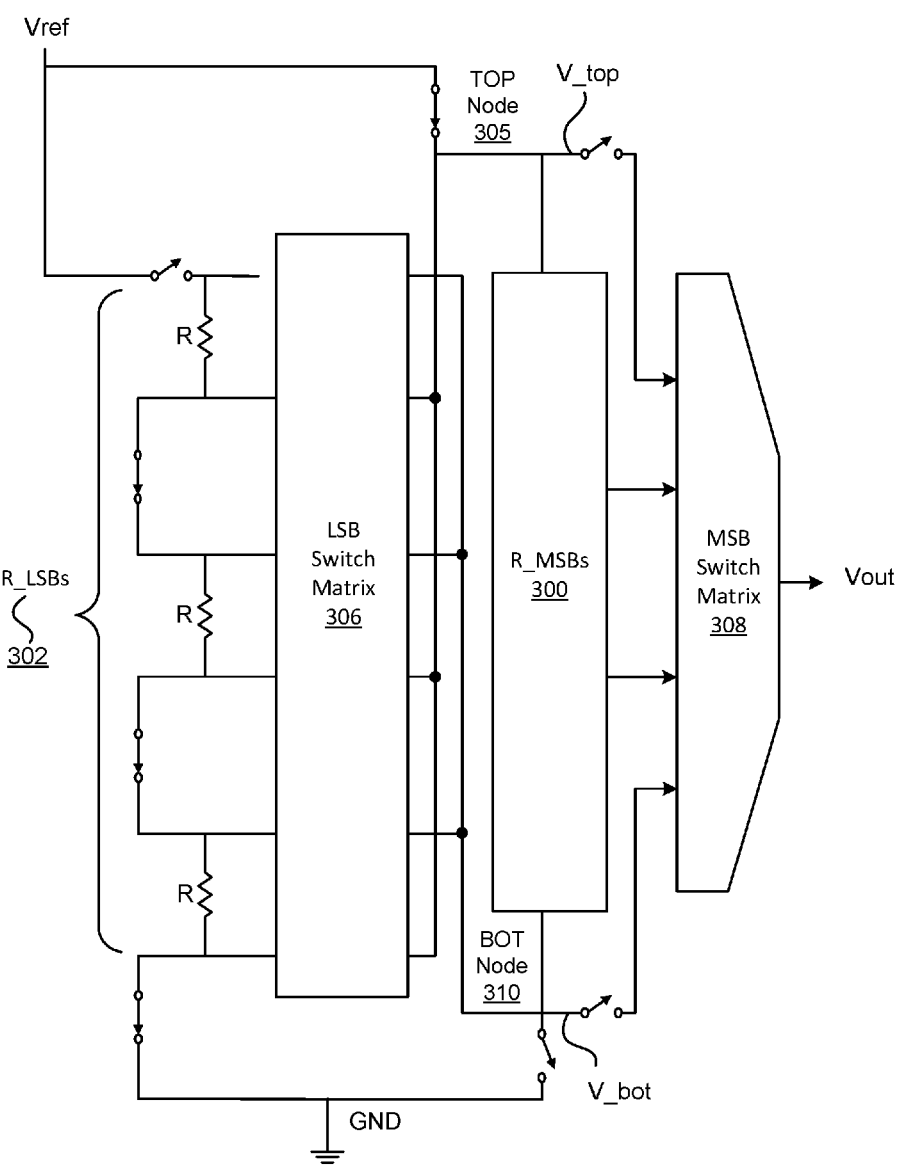
FIG. 3 depicts an overview block diagram of an example embodiment of a segmented resistor DAC that utilizes resistor recycling in accordance with techniques described in this disclosure.

FIG. 3 depicts an overview block diagram of an example embodiment of a segmented resistor DAC that utilizes resistor recycling in accordance with the techniques described in this disclosure. In the illustrated embodiment, circuit 30 implements a 4-bit DAC in a 2-2 configuration (i.e., the input digital code word segmented into 2 MSBs and 2 LSBs). Circuit 30 includes a set of MSB resistors R_MSBs 300 having nodes connected in series between the top node 305 and bottom node 310 of the set of MSB resistors to form a MSB series resistor ladder 300. V_top is the voltage at the top node 305 of the MSB resistor ladder 300 and V_bot is the voltage at the bottom node 310 of the MSB resistor ladder 300.

The resistors of the MSB resistor ladder 300 may further be coupled between a high reference voltage $V_{REF}$ of circuit 30 and a low reference voltage GND of circuit 30, and the nodes of the MSB resistor ladder 300 may be selectively coupled with the output node of circuit 30 via the MSB switch matrix 308. As shown, the high reference voltage $V_{REF}$ can be selectively coupled with the top node 305 of the MSB resistor ladder 300 and the low reference voltage GND can be selectively coupled with the bottom node 310 of the MSB resistor ladder 300. The MSB resistor ladder 300 may comprise a first plurality of nodes. The selective coupling depends on the decoded bit pattern for the LSBs of the input digital code word.

At least certain of the first plurality of nodes of the MSB resistor ladder 300 may be coupled with the MSB switch matrix 308 comprising a set of switches. In one embodiment, the MSB switch matrix 308 functions as an output multiplexer for circuit 30. The MSB switch matrix 308 can be coupled to receive the MSBs of the input digital code word to control the opening and closing of the switches in the MSB switch matrix 308. The switches in the MSB switch matrix 308 can be configured to selectively couple one or more voltage levels of the nodes of the MSB resistor ladder 300 with an output node of the segmented resistor DAC circuit 30 to provide an output voltage Vout based on the value of the MSBs and LSBs of the input digital code word.

Circuit 30 further includes a set of LSB resistors R_LSBs 302 connected in series. As discussed above, certain of R_LSBs 302 can be selectively coupled either into the resistive path between the high reference voltage of the circuit $V_{REF}$ and the top node 305 of the MSB resistor ladder 300, while the remaining R_LSBs 302 can be selectively coupled into the resistive path between the bottom node 310 of the MSB resistor ladder 300 and the low reference voltage of the circuit GND, and vice versa, depending on the value of the LSBs of the input digital code word.

The LSB resistor ladder 302 also includes a plurality of nodes coupled with a LSB switch matrix 306 comprising a set of switches. The switches of the LSB switch matrix 306 may be coupled to receive the LSBs of the input of digital code word, which can be configured to control the opening and closing of the switches in the set of switches of the LSB switch matrix 306. In the preferred embodiment, certain of the switches of the LSB switch matrix 306 can be configured to selectively couple the top node of the LSB resistor ladder 302 with the bottom node 310 of the MSB resistor ladder 300, and to selectively couple the bottom node of the LSB resistor ladder 302 with the top node 305 of the MSB resistor ladder 300 in a figure-eight type arrangement. This is shown in more detail with reference to FIGS. 4A-6 described below.

It should be noted that the set of switches of the LSB switch matrix 306 and the MSB switch matrix 308 can be implemented with transistor device technology. In other embodiments, other well-known switching devices or mechanisms may be used. The techniques described in this disclosure are not limited to any particular type of switching device or mechanism.

In one embodiment, a first plurality of nodes of the MSB resistor ladder 300 comprises $2^M$ nodes and a second plurality of nodes of the LSB resistor ladder 302 comprises $2^N$ nodes, where M represents the number of MSBs in the input digital code word and N represents the number of LSBs in the input digital code word.

Figure 4A:
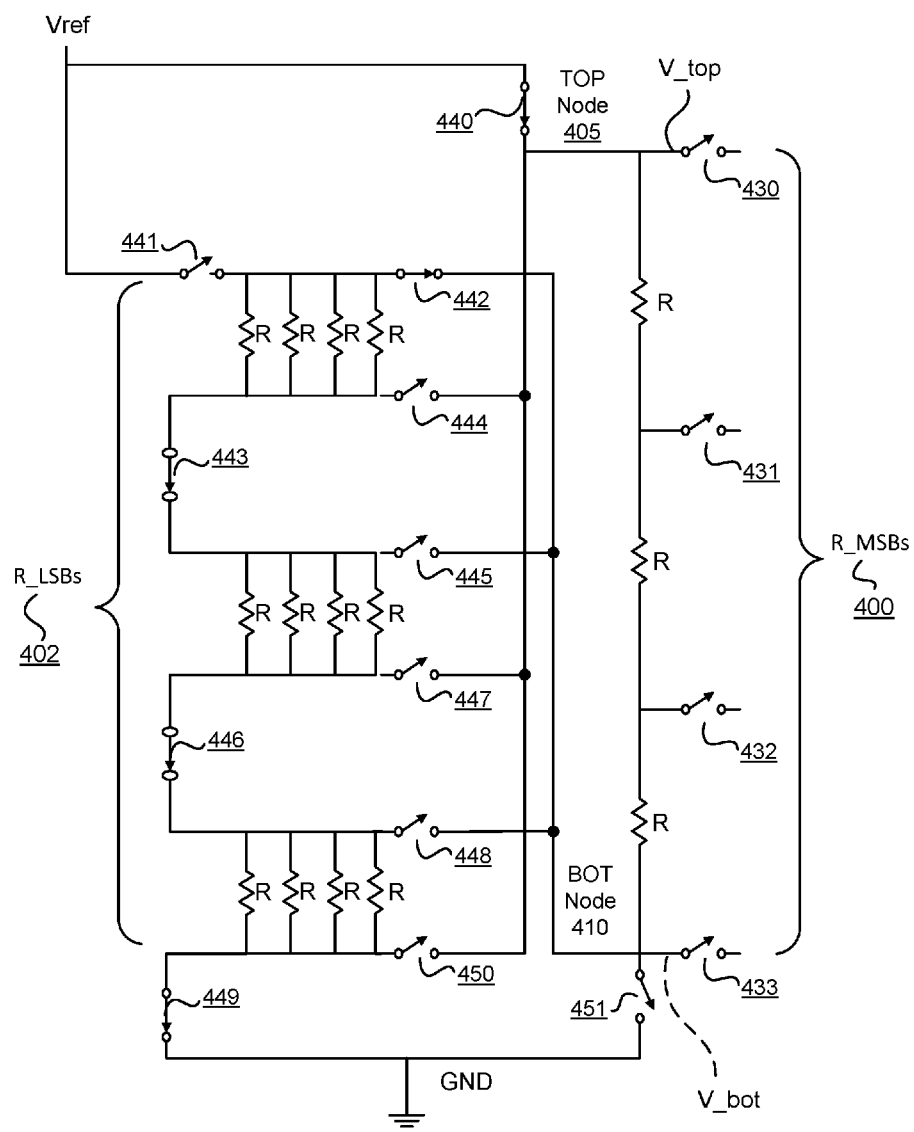
FIG. 4A depicts a circuit diagram of an example embodiment of a segmented resistor DAC that utilizes resistor recycling in accordance with techniques described in this disclosure.

FIG. 4A depicts a circuit diagram of an example embodiment of a segmented resistor DAC configured to utilize resistor recycling in accordance with the techniques described in this disclosure. In the illustrated embodiment, circuit 40 implements a 4-bit DAC in a 2-2 configuration (i.e., 2 MSBs and 2 LSBs). Circuit 40 includes a set of MSB resistors R_MSBs 400 comprising a plurality of nodes connected in series between a top node 405 and bottom node 410 of the MSB resistor ladder 400, and a set of LSB resistors R_LSBs 402 comprising a plurality of nodes that can be selectively connected in series between $V_{REF}$ and GND.

In one embodiment, the resistors R_MSBs 400 have a resistance value equal to "R" and the resistors R_LSBs 402 have a resistance value of "$R/2^N$" when connected in parallel as shown in circuit 40, where N corresponds to the number of segmented LSBs in the input digital code word. In FIG. 4A, the number N of LSBs is equal to 2 (4-bit DAC in 2-2 configuration). Thus according to the formula $R/2^N$, the value of the resistors R_LSBs 402 is equal to R/4 (which is depicted as 4 resistors of resistance value "R" connected in parallel for a resulting value of R/4). The resistance values $R/2^N$ in the LSB resistor ladder 402 can be implemented using multiple resistors of value R in parallel. In this example, the resistance value of R/4 is achieved using 4 resistors of value R in parallel.

In the depicted embodiment, V_top represents the voltage level at the top node 405 of the MSB resistor ladder 400 and V_bot represents the voltage at the bottom node 410 of the MSB resistor ladder 400. The high reference voltage $V_{REF}$ can be selectively coupled with the top node 405 of the MSB resistor ladder 400 and the low reference voltage GND can be selectively coupled with the bottom node 410 of the MSB resistor ladder 400.

In FIG. 4A, the nodes of the MSB resistor ladder 400 are coupled with a plurality of switches 430-433. Switches 430-433 may be coupled to receive the MSBs of the input of digital code word at the inputs of the DAC (not shown). The MSBs of the input digital code word can be coupled to control the opening and closing of the switches 430-433. Switches 430-433 can further be configured to selectively couple one or more of the nodes of the MSB resistor ladder 300 with an output node (not shown) of circuit 30 based on the value of the MSBs of the input digital code word. Similarly, the nodes of the LSB resistor ladder 402 are coupled with the plurality of switches 440-451. Switches 440-451 may be coupled to receive the LSBs of the input of digital code word at the inputs of the DAC (not shown). The LSBs control the opening and closing of the switches 440-451.

Figure 4B:
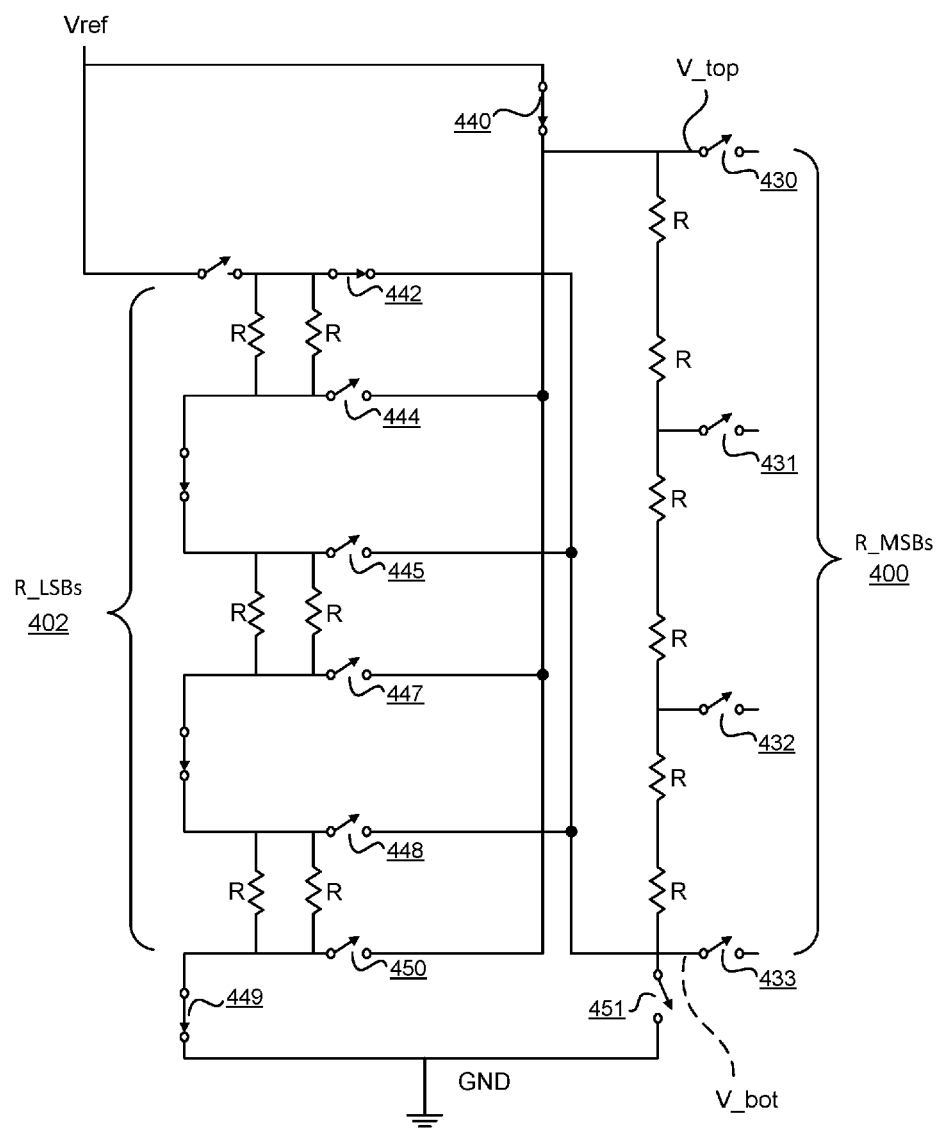
FIG. 4B depicts a circuit diagram of an alternative example embodiment of a segmented resistor DAC that utilizes resistor recycling in accordance with the techniques described in this disclosure.

FIG. 4B depicts a circuit diagram of an alternate example embodiment of a segmented resistor DAC that utilizes resistor recycling in accordance with the techniques described in this disclosure. Circuit 40 implements a 4-bit DAC in the 2-2 configuration. FIG. 4B illustrates the relationship between the values of the MSB resistors 400 and the LSB resistors 402. In at least certain embodiments, when the R_MSBs 400 have a resistance value equal to R, the R_LSBs 402 have a resistance value equal to $R/2^N$, where N is the number of LSBs segmented from the input digital code word.

As shown, the R_MSBs 400 include two resistors of value R connected in series between switches 430-433 of the MSB resistor ladder 400. In such a case, the value of the MSB resistors 400 between nodes of the MSB resistor ladder is equal to 2R. The value of the LSB resistors can therefore be given by $2R/2^N$ or $R/2^{N-1}$. For a 4-bit DAC (2-2) this means that the resistance value of the LSB resistors 402 is equal to R/2 (which is shown as two resistors of resistance value R in parallel between nodes of the R_LSBs 402 of the LSB resistor ladder.

These embodiments are shown and described in more detail with reference to FIGS. 4C-4F discussed below, which depict values of the LSBs of the input digital code word for the circuit embodiment shown in FIG. 4B. In the embodiments depicted in FIGS. 4C-4F, circuit 40 includes a first set of MSB switches 430-433 for selectively coupling one or more nodes of the MSB resistor ladder with the output (not shown) of the DAC 40 based on the values of the MSBs (3, 2). Specifically, the operation of switch 430 is configured to close when MSBs (3, 2)=(1, 1), the operation of switch 431 is configured to close when MSBs (3, 2)=(1, 0), the operation of switch 432 is configured to close when MSBs (3, 2)=(0, 1), and the operation of switch 433 is configured to close when MSBs (3, 2)=(0, 0).

In the embodiments of FIGS. 4C-4F, circuit 40 further includes a second set of LSB switches 440-451 for selectively switching the resistors in the LSB resistor ladder either into the resistive path between $V_{REF}$ and the top node V_top of the MSB resistor ladder or into the resistive path between the bottom node V_bot of the MSB resistor ladder and GND based on the value of the LSBs (B1, B0). In these embodiments, switch 440 is configured to close when LSBs (B1, B0)=(1, 1), switch 441 is configured to close when LSBs (B1, B0) (1, 1), switch 442 is configured to close when LSBs (B1, B0)=(1, 1), switch 443 is configured to close when LSBs (B1, B0)≠(1, 0), switch 444 is configured to close when LSBs (B1, B0)=(1, 0), switch 445 is configured to close when LSBs (B1, B0)=(1, 0), switch 446 is configured to close when LSBs (B1, B0)≠(0, 1), switch 447 is configured to close when LSBs (B1, B0)=(0, 1), switch 448 is configured to close when LSBs (B1, B0)=(0, 1), switch 449 is configured to close when LSBs (B1, B0)≠(0, 0), switch 450 is configured to close when LSBs (B1, B0)=(0, 0), and switch 451 is configured to close when LSBs (B1, B0)=(0, 0).

With reference to FIGS. 4C-4F, in operation, the resistors in the LSB resistor ladder can be selectively switched either into the resistive path between $V_{REF}$ and the top node of the MSB resistor ladder based on the value of the LSBs in the input digital code word, or into the resistive path between the bottom node of the MSB resistor ladder and GND based on the value of the LSBs in the input digital code word. That is, when one or more of the resistors of the LSB resistor ladder are selectively switched into the resistive path between $V_{REF}$ and the top node of the MSB resistor ladder, the remaining LSB resistors are switched into the resistive path between the bottom node of the MSB resistor ladder and GND. And vice versa, when one or more of the resistors of the LSB resistor ladder are selectively switched into the resistive path between the bottom node of the MSB resistor ladder and GND, the remaining LSB resistors are switched into the resistive path between the top node of the MSB resistor ladder and the high reference voltage $V_{REF}$.

This is one example of how resistor recycling can be accomplished using the techniques described in this disclosure. All resistors in the circuit may be utilized for each possible combination of bits in the input digital code word. The LSB resistors of the LSB resistor ladder that are selectively switched out from the resistive path below the bottom node of the MSB resistor ladder are switched into the resistive path above the top node of the MSB resistor ladder, and the LSB resistors of the LSB resistor ladder that are selectively switched out from the resistive path above the top node of the MSB resistor ladder are switched into the resistive path below the bottom node of the MSB resistor ladder. Accordingly, one or more of the LSB resistors can be switched into the resistive path between $V_{REF}$ and the top node of the MSB resistor ladder or into the resistive path between the bottom node of the MSB resistor ladder and GND.

Figure 4C:
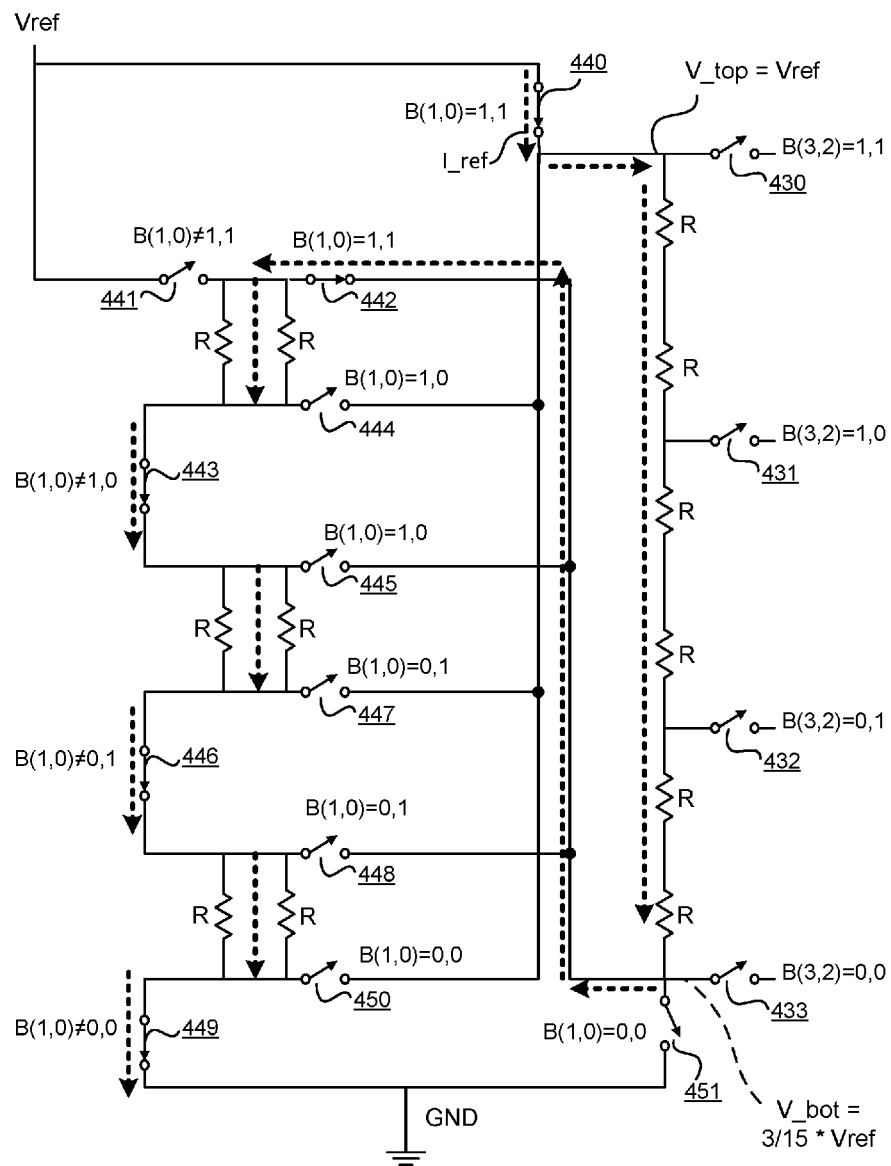
FIGS. 4C-4F depict a switch configuration for the circuit embodiment of the segmented resistor DAC shown in FIG. 4B.

The illustrated embodiment of FIG. 4C depicts a 4-bit DAC in a 2-2 configuration for the MSBs and LSBs, respectively, of the input digital code word. In this embodiment LSBs (B1, B0) are set equal to (1, 1). This causes LSB switches 440, 442, 443, 446, and 449 to close, which opens up a path for current I_ref to flow through the resistive path from $V_{REF}$ to GND as shown by the dotted lines. In this case, the top node V_top of the MSB resistor ladder is coupled directly with $V_{REF}$ via switch 440. This represents the highest voltage level case at the output node of the segmented resistor DAC where the voltage at the top node V_top of the MSB resistor ladder is equal to $V_{REF}$. This effectively shifts the top node V_top of the MSB resistor ladder up to the highest voltage level $V_{REF}$ in the circuit based on the LSB values (1, 1).

The bottom node V_bot of the MSB resistor ladder, on the other hand, is coupled with GND through the entire LSB resistor ladder (three resistive elements) as shown by operation of switches 442, 443, 446, and 449. The current I_ref flowing in the resistive path from V_bot to GND, therefore, flows through all the resistive elements in the LSB resistor ladder. This also effectively shifts the bottom node V_bot of the MSB resistor ladder up to its highest voltage level. In this case, the voltage at V_bot=$3/15*V_{REF}$.

In at least certain embodiments, the output voltage level at the output node of the improved segmented resistor DAC described in this present disclosure can be generated based on summing together the voltages at the nodes of the MSB resistor ladder that are selectively coupled with the output node via switches 430-433. The voltage level at the nodes of the MSB resistor ladder is, correspondingly, determined based on how many LSB resistors of the LSB resistor ladder are selectively switched into the resistive path above the top node of the MSB resistor ladder as compared to the number of LSB resistors that are switched into the resistive path below the bottom node of the MSB resistor ladder.

Figure 4D:
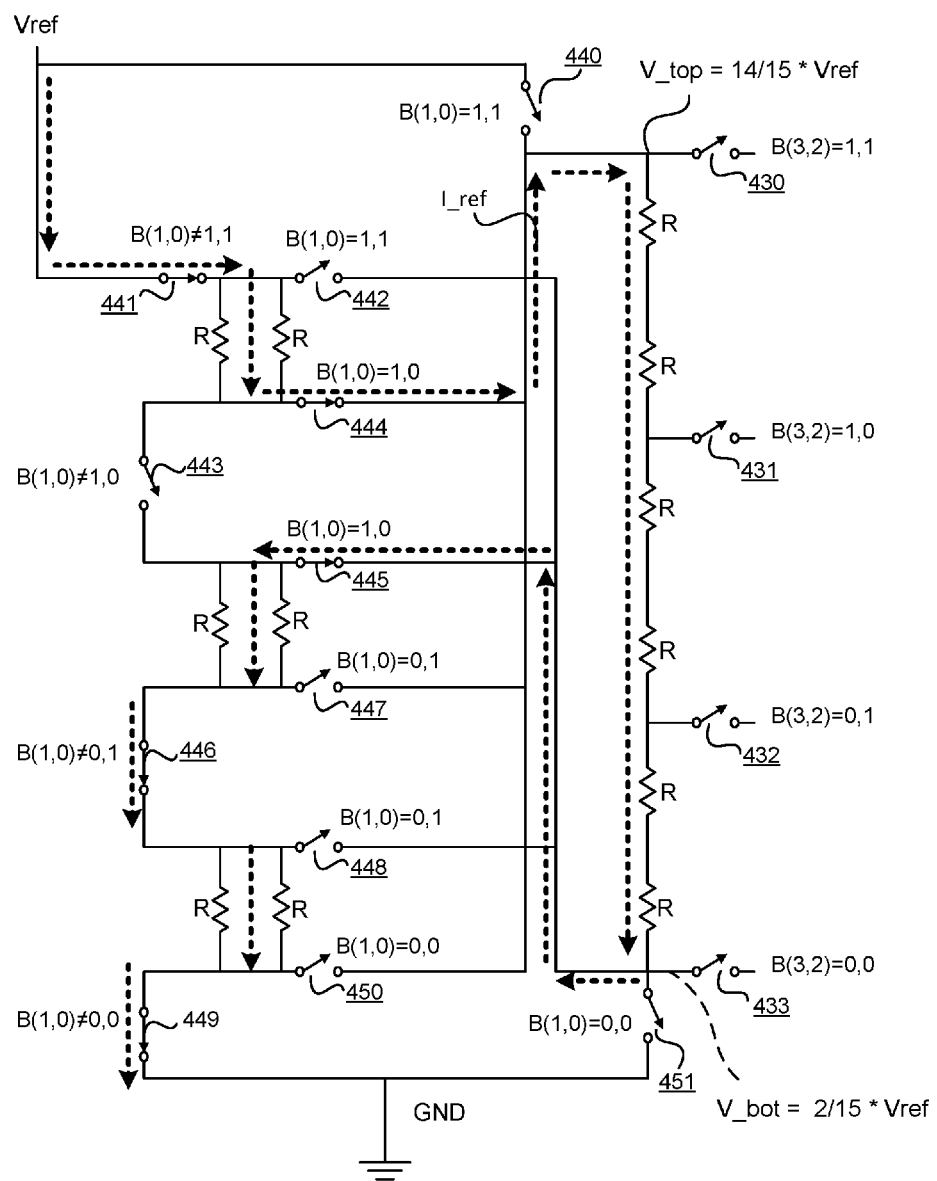

The illustrated embodiment of FIG. 4D depicts a 4-bit DAC (2-2) with LSBs (B1, B0) set equal to (1, 0). This causes LSB switches 441, 444, 445, 446, and 449 to close, which opens up a path for the current I_ref to flow through the resistive path from $V_{REF}$ to GND as shown by the dotted lines. In this case, the top node V_top of the MSB resistor ladder is coupled with $V_{REF}$ via the top resistors in the LSB resistor ladder by operation of switches 441 and 444. The current I_ref flowing in the resistive path from $V_{REF}$ to V_top, therefore, flows through this resistive element in the LSB resistor ladder. This represents the first incremental step down in the output node of the segmented resistor DAC from the highest output voltage level case. This effectively shifts the top node V_top of the MSB resistor ladder down one LSB from the high reference voltage $V_{REF}$ based on setting the LSBs (B1, B0) equal to (1, 0). In this case, the voltage at V_top is equal to $14/15*V_{REF}$.

The bottom node V_bot of the MSB resistor ladder, on the other hand, is coupled with GND through two of the LSB resistors in the LSB resistor ladder by operation of switches 445, 446, and 449. The current I_ref flowing in the resistive path from V_bot to GND, therefore, flows through these two resistive elements. This effectively shifts the bottom node V_bot of the MSB resistor ladder incrementally down one LSB from its highest voltage level based on setting the LSBs (B1, B0) equal to (1, 1). In this case, the voltage at V_bot=$2/15*V_{REF}$.

Figure 4E:
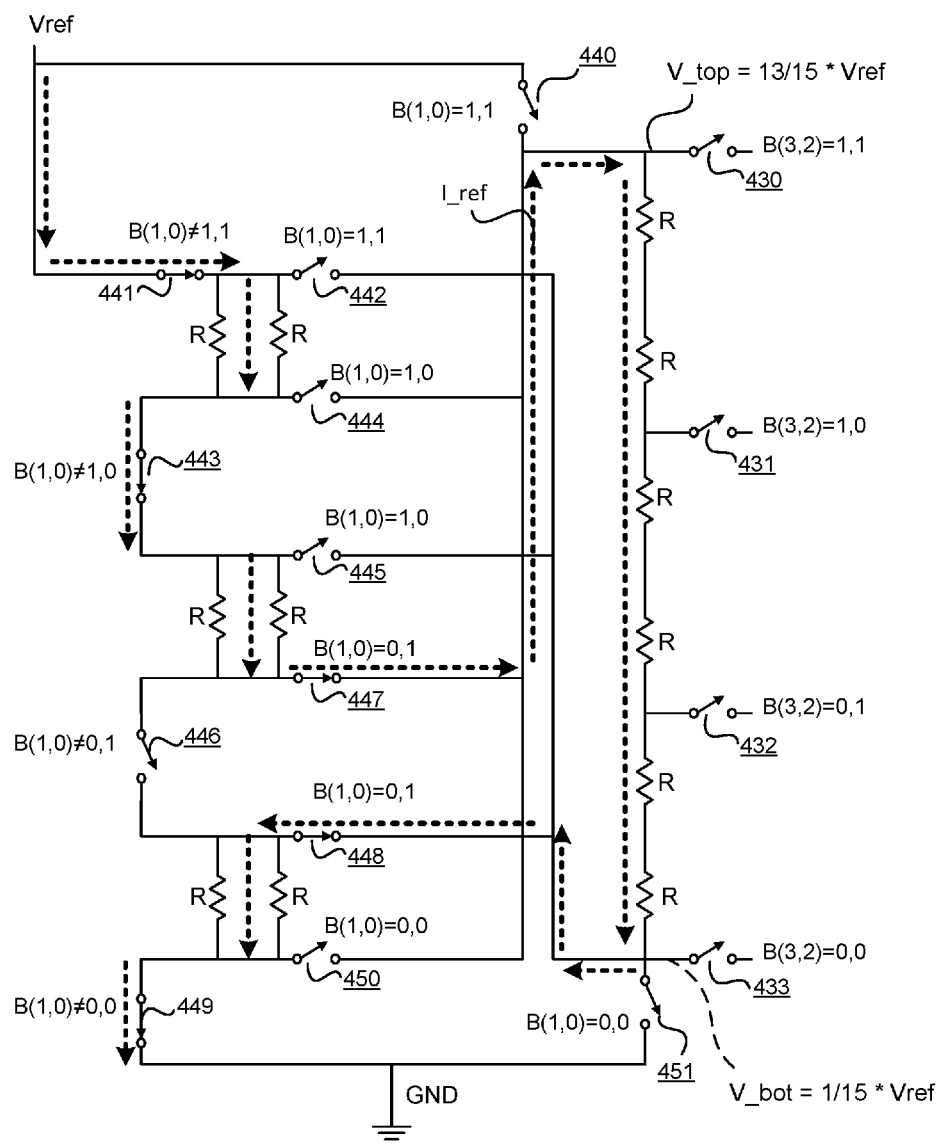

The illustrated embodiment of FIG. 4E depicts a 4-bit DAC (2-2) with LSBs (B1, B0) set equal to (0, 1). This causes LSB switches 441, 443, 447, 448, and 449 to close. This opens up a path for the current I_ref to flow through the resistive path from $V_{REF}$ to GND as shown by the dotted lines. In this case, the top node V_top of the MSB resistor ladder is coupled with $V_{REF}$ via two of the LSB resistors in the LSB resistor ladder by operation of the switches 441, 443, and 447 as shown. The current I_ref flowing in the resistive path from $V_{REF}$ to V_top, therefore, flows through these two resistive elements in the LSB resistor ladder. This represents a second incremental step down in voltage at the output node of the segmented resistor DAC from the highest output voltage level case. This effectively shifts the top node V_top of the MSB resistor ladder down two LSBs from the highest voltage in the circuit $V_{REF}$ based on setting the LSBs (B1, B0) equal to (0, 1). In this case, the voltage at V_top is equal to $13/15*V_{REF}$.

The bottom node V_bot, on the other hand, is coupled with GND through one of the LSB resistors in the LSB resistor ladder by operation of switches 448 and 449. The current I_ref flowing in the resistive path from V_bot to GND, therefore, flows through this resistive element in the LSB resistor ladder. This effectively shifts the bottom node V_bot of the MSB resistor ladder incrementally down a second LSB from its highest voltage level based on setting the LSBs (B1, B0) equal to (0, 1). In this case, the voltage at V_bot=$1/15*V_{REF}$.

Figure 4F:
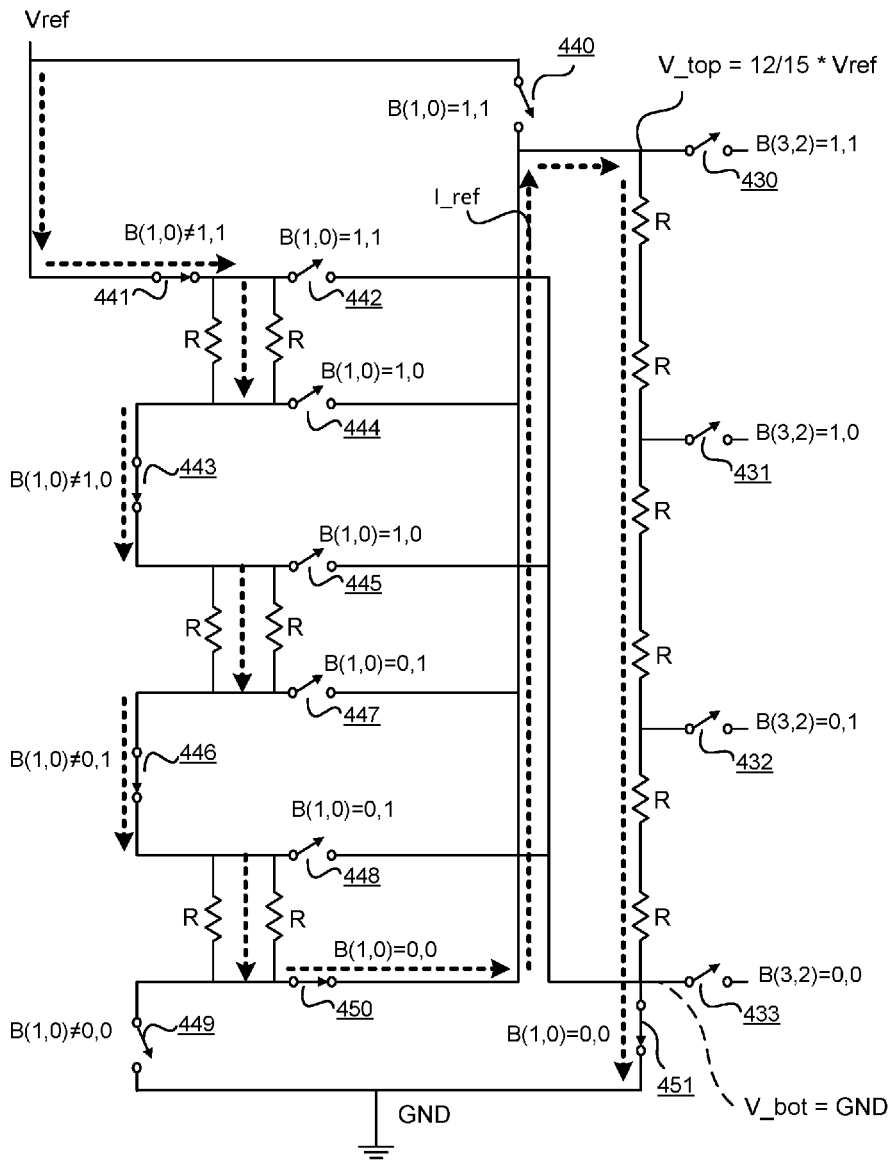

The illustrated embodiment of FIG. 4F depicts a 4-bit DAC (2-2) with LSBs (B1, B0) set equal to (0, 0). This causes LSB switches 441, 443, 446, 450, and 451 to close. This opens up a path for the current I_ref to flow through the resistive path from $V_{REF}$ to GND as shown by the dotted lines. In this case, the top node V_top of the MSB resistor ladder is connected to $V_{REF}$ via the entire LSB resistor ladder (three resistive elements) by operation of switches 441, 443, 446, and 450. The current I_ref flowing in the resistive path from $V_{REF}$ to V_top, therefore, flows through all these resistive elements in the LSB resistor ladder. This represents the lowest output voltage level case where the top node V_top of the MSB resistor ladder is shifted all the way down to its lowest voltage level. This effectively shifts V_top down to the lowest voltage level based on setting the LSBs (B1, B0) equal to (0, 0). In this case, the voltage at V_top is equal to $12/15*V_{REF}$.

The bottom node V_bot of the MSB resistor ladder, on the other hand, is coupled directly with GND via switch 451. This also effectively shifts the voltage level of V_bot down to its lowest voltage level based on setting the LSBs (B1, B0) equal to (0, 0). In this case, the voltage level at V_bot is equal to 0.

Figure 5:
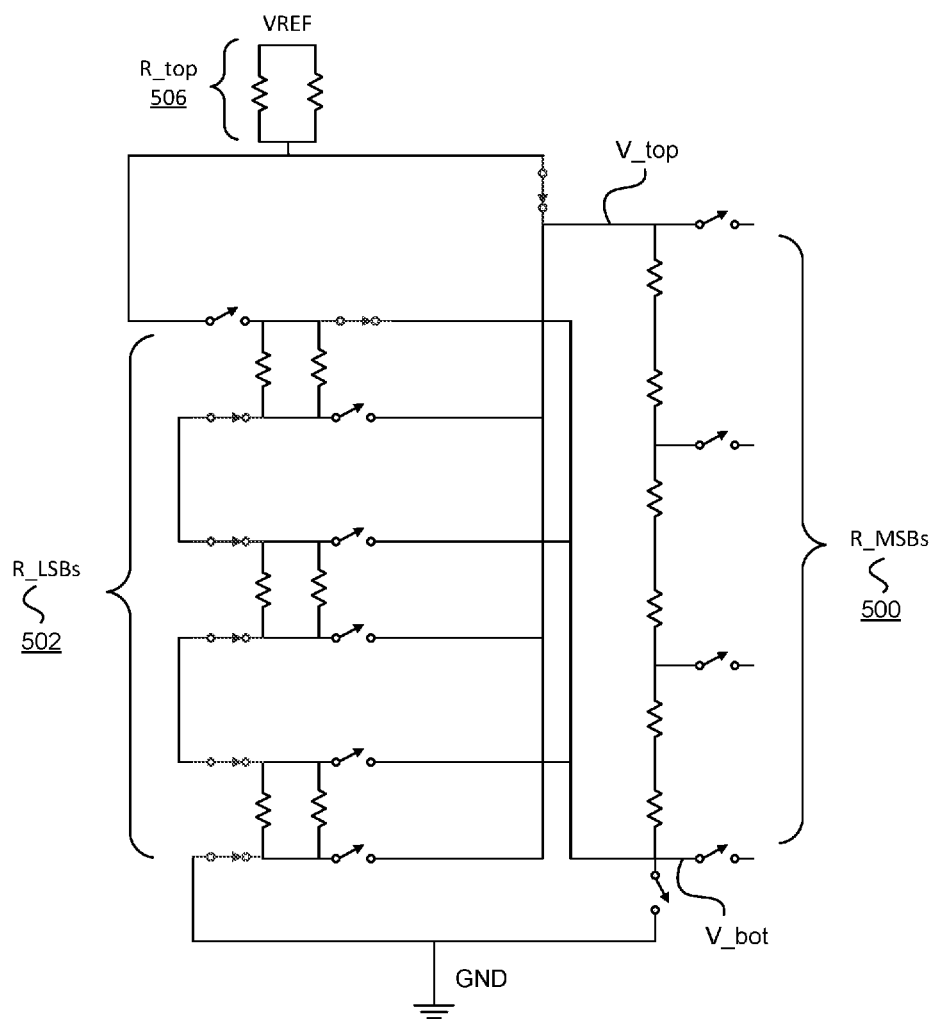
FIG. 5 depicts a circuit diagram of an alternative embodiment a segmented resistor DAC that utilizes resistor recycling in accordance with the techniques described in this disclosure.

FIG. 5 depicts a circuit diagram of an alternative embodiment a segmented resistor DAC that utilizes resistor recycling according to the techniques described in this disclosure. FIG. 5 shows a 4-bit DAC (2-2) with LSBs (B1, B0) set equal to (1, 1). In the illustrated embodiment, circuit 50 includes a MSB resistor ladder 500 having a plurality of nodes including a top node V_top and a bottom node V_bot. MSB resistor ladder 500 is connected with a first set of switches. Circuit 50 further includes a LSB resistor ladder 502 having a plurality of nodes and connected between the top node V_top and the bottom node V_bot of the MSB resistor ladder 500. The LSB resistor ladder 502 is connected with a second set of switches.

In this circuit configuration, the highest achievable voltage level for the top node V-top of the MSB resistor ladder 500 is one LSB down from the full scale reference voltage $V_{REF}$ of the circuit 50. This is because of the additional resistance value R_top 506 placed at the top of the segmented resistor DAC 50. V_top in this case reaches its maximum at V_top=$V_{REF}$−(I_ref*R_top), which is one LSB voltage level down from $V_{REF}$.

Figure 6:
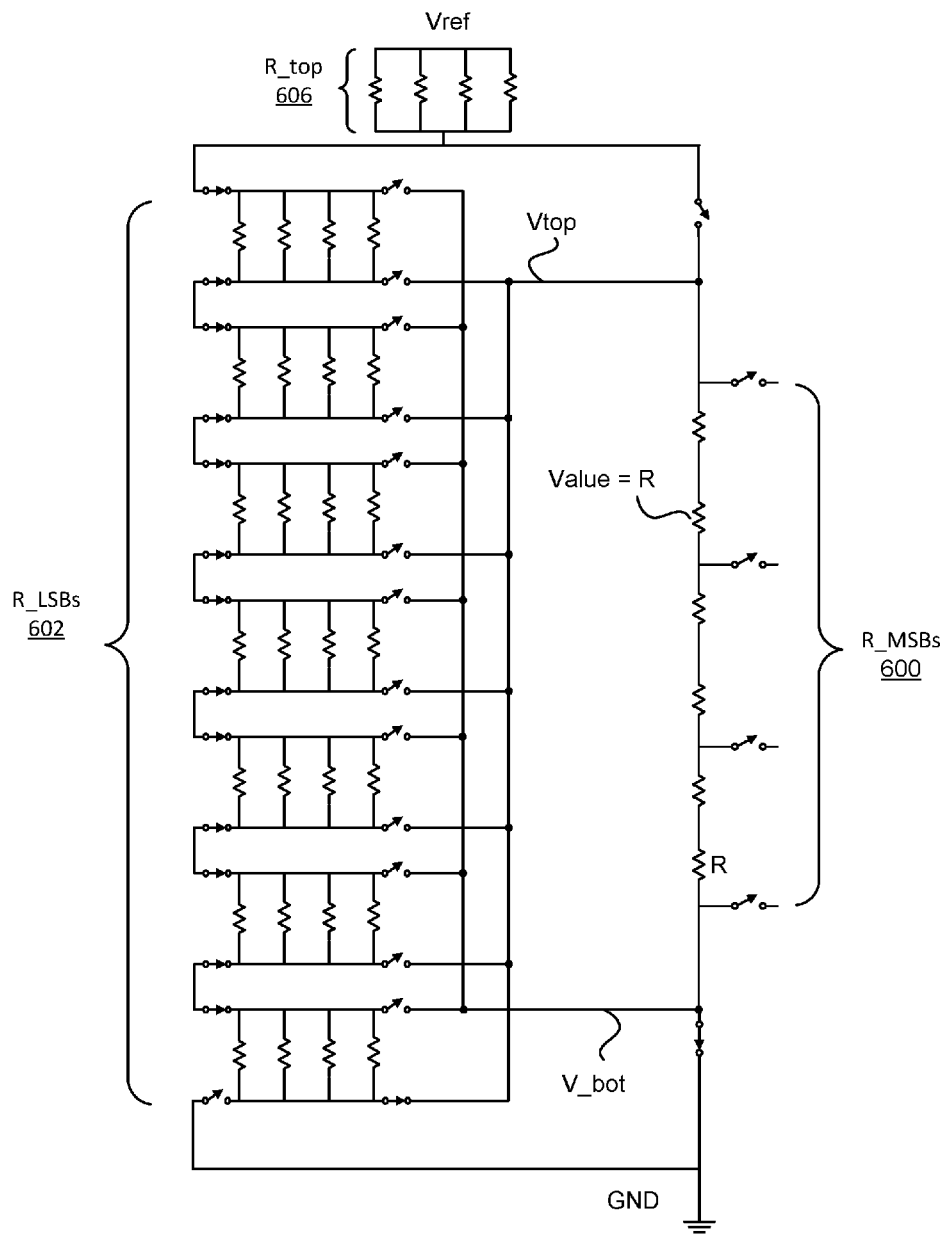
FIG. 6 depicts a circuit diagram of an embodiment of a 5-bit segmented resistor DAC in a 2-3 bit configuration in accordance with the techniques described in this disclosure.

FIG. 6 depicts a circuit diagram of an alternative embodiment a segmented resistor DAC that utilizes resistor recycling according to the techniques described in this disclosure. FIG. 6 shows a 5-bit segmented resistor DAC in a (2-3) configuration with LSBs (B2, B1, B0) set equal to (0, 0, 0). In the illustrated embodiment, circuit 60 includes a MSB resistor ladder 600 having a plurality of nodes including a top node V_top and a bottom node V_bot. MSB resistor ladder 600 is connected with a first set of switches as shown. Circuit 60 further includes a LSB resistor ladder 602 having a plurality of nodes connected with a second set of switches.

In this circuit configuration, the highest achievable voltage level for the MSB resistor ladder 600 is one LSB level down from $V_{REF}$ because of the additional resistance value R_top 606 at the top of the segmented resistor DAC 60. The voltage level at V_top in this case reaches its maximum at V_top=$V_{REF}$−(I_ref*R_top), which is one voltage level down from $V_{REF}$.

In FIG. 6, the resistance value between the nodes of the MSB resistor ladder 600 are equal to 2R. The value of the LSB resistors in the LSB resistor ladder 602 is therefore equal to $2R/2^3$ since the number N of LSBs is equal to three in circuit 60. The LSB resistor values are therefore equal to R/4. This is shown as four resistors R in parallel in this example.

Figure 7:
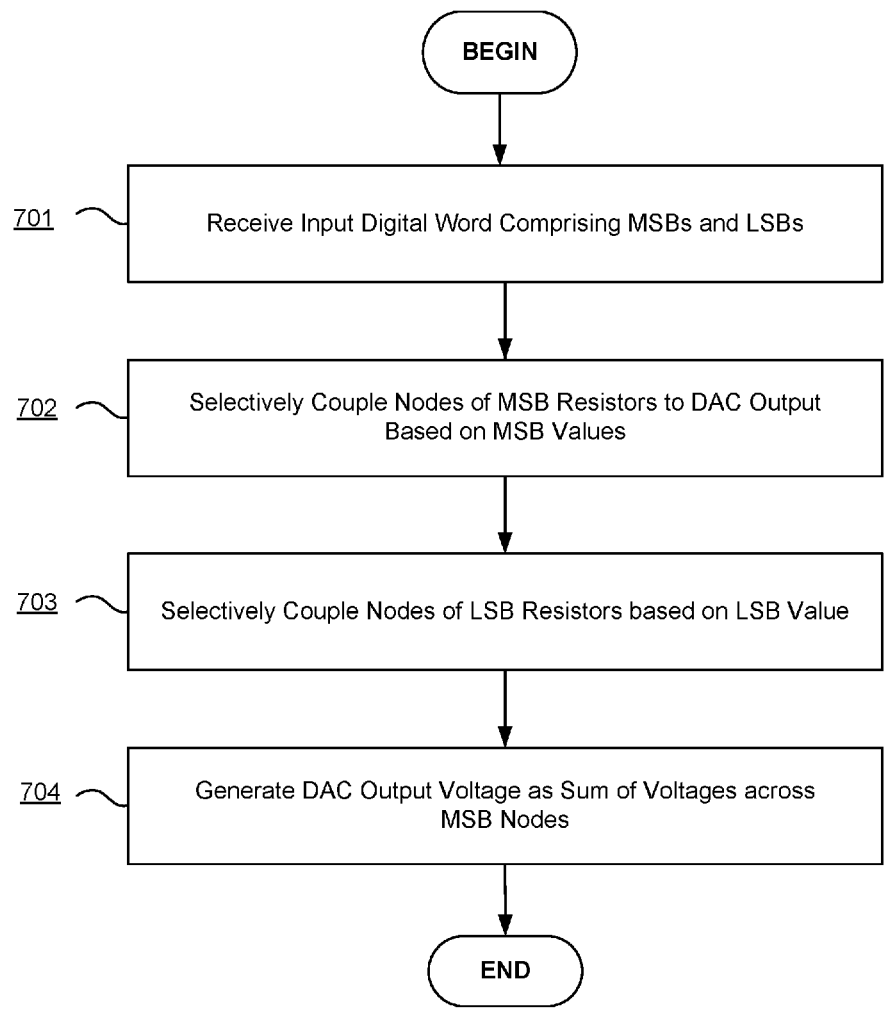
FIG. 7 depicts a flow chart of an example embodiment of a process for utilizing a segmented resistor DAC with resistor recycling in accordance with the techniques described in this disclosure.

FIG. 7 depicts a flow chart of an example embodiment of a process for utilizing a segmented resistor DAC with resistor recycling in accordance with the techniques described in this disclosure. The processes described below are exemplary in nature and are provided for illustrative purposes and not intended to limit the scope of the embodiments described in this disclosure to any particular example embodiment. For instance, processes in accordance with some embodiments may include or omit some or all of the operations described below, or may include steps in a different order than those described. These particular processes are not intended to be limited to any particular set of operations exclusive of all other potentially intermediate operations.

The operations of these processes may be embodied in computer-executable code, which causes a general-purpose or special-purpose computer to perform certain functional operations. In other in stances, these operations may be performed by specific hardware components or hardwired circuitry, or by any combination of programmed computer components and custom hardware circuitry.

In the illustrated embodiment, process 700 begins at operation 701 by receiving an input digital code word segmented into a set of M MSBs and a set of N LSBs.

Process 700 continues at operation 702 by selectively coupling, using a first set of switches, one or more of a first set of nodes of MSB resistors in a MSB resistor ladder with an output node (not shown) of the segmented resistor DAC based on the values of the MSBs in the input digital code word (not shown). The set of MSB resistors in the MSB resistor ladder may be coupled together in series between a top node and a bottom node as described previously.

Process 700 further includes the operation of selectively coupling, using a second set of switches, one or more of a second set of nodes of LSB resistors in a LSB resistor ladder either into the resistive path above the top node of the MSB resistor ladder or below the bottom node of the MSB resistor ladder based on the values of the set of N LSBs. In one embodiment, the MSB resistors have a resistance value equal to R and the LSB resistors have a resistance value equal to $R/2^N$ as described above. The first plurality of nodes of the MSB resistor ladder may comprise $2^M$ nodes and the second plurality of nodes of the LSB resistor ladder may comprise $2^N$ nodes.

In one embodiment, the LSB resistors that are selectively switched out of the resistive path below the bottom node of the MSB resistor ladder are switched into the resistive path above the top node of the MSB resistor ladder, and likewise, the LSB resistors that are selectively switched out of the resistive path above the top node of the MSB resistor ladder are switched into the resistive path below the bottom node of the MSB resistor ladder.

In one embodiment, the MSBs of the input digital code word are coupled with the first set of switches and the LSBs are coupled with the second set of switches. The first set of switches can be controlled by the value of the MSBs and the second set of switches can be controlled by the value of the LSBs.

Process 700 continues at operation 704 where the output voltage at the output node of the segmented resistor DAC is generated based on the sum of the voltages across the nodes of the MSB resistor ladder. That is, the output voltage is generated based on the sum of voltages across the first set of nodes of the first set of resistive elements in the MSB resistor ladder. In this example, the resistors of the second set of resistive elements in the LSB resistor ladder may be utilized to shift the voltage level of the nodes of the MSB resistor ladder incrementally up or down depending on the value of the LSBs in the input digital code word.

This completes process 700 according to one example embodiment.

Throughout the foregoing description, for the purposes of explanation, numerous specific details were set forth in order to provide a thorough understanding of the disclosure. It will be apparent, however, to persons skilled in the art that these embodiments may be practiced without some of these specific details. The above examples and embodiments should not be deemed to be the only embodiments, and are presented to illustrate the flexibility and advantages of the present disclosure. Other arrangements, embodiments, implementations and equivalents will be evident to those skilled in the art and may be employed without departing from the spirit and scope of the invention as defined by the following claims.

What is claimed is:

1. A circuit comprising:
   a first resistor ladder comprising a first set of resistive elements and corresponding first set of nodes, the first set of resistive elements connected in series between a top node and a bottom node of the first resistor ladder;
   a first set of switches coupled with the first set of nodes, the first set of switches operable to selectively couple one or more of the first set of nodes with an output node based on a value of a first set of inputs;
   a second resistor ladder comprising a second set of resistive elements and a second set of switches arranged in an alternating series and a corresponding second set of nodes; and
   a third set of switches coupled with the second set of nodes, the second and third sets of switches operable to selectively couple resistors of the second set of resistive elements into a resistive path between a high reference voltage and the top node of the first resistor ladder or into a resistive path between the bottom node of the first resistor ladder and a low reference voltage based on a value of a second set of inputs.

2. The circuit of claim 1 wherein resistive elements of the second set of resistive elements that are selectively switched out of the resistive path between the high reference voltage and the top node of the first resistor ladder are switched into the resistive path between the bottom node of the first resistor ladder and the low reference voltage.

3. The circuit of claim 1 wherein resistive elements of the second set of resistive elements that are selectively switched out of the resistive path between the bottom node of the first resistor ladder and the low reference voltage are switched into the resistive path between the high reference voltage and the top node of the first resistor ladder.

4. The circuit of claim 1 wherein the first set of inputs comprises a set of M most-significant-bits (MSBs) of an input digital code word and the second set of inputs comprises a set of N least-significant bits (LSBs) of the input digital code word.

5. The circuit of claim 4 wherein the first set of resistive elements comprise a resistance value R and the second set of resistive elements comprise a resistance value $R/2^N$, where N is equal to the number of LSBs in the input digital code word.

6. The circuit of claim 4 wherein the set of M MSBs of the input digital code word is coupled with the first set of switches and the set of N LSBs of the input digital code word is coupled with the second and third sets of switches.

7. The circuit of claim 6 wherein the first set of nodes comprises $2^M$ nodes and the second set of nodes comprises $2^N$ nodes.

8. The circuit of claim 1 wherein the first set of switches is controlled by the value of the first set of inputs and the and third sets set of switches are controlled by the value of the second set of inputs.

9. The circuit of claim 1 wherein a voltage level at the output node equals a sum of voltage levels of nodes of the first set of nodes that have been selectively coupled with the output node.

10. The circuit of claim 9 wherein the voltage levels of the nodes of the first set of nodes of the first resistor ladder are based on a number of the second set of resistors that are switched into the resistive path above the top node of the first resistor ladder and below the bottom node of the first resistor ladder.

11. A method comprising:
   receiving a first set of inputs and a second set of inputs;
   selectively coupling, using a first set of switches, a first set of nodes of a first set of resistive elements of a first resistor ladder with an output node of a digital-to-analog converter ("DAC") circuit based on a value of the first set of inputs, wherein the first set of resistive elements are connected in series between a top node and a bottom node of the first resistor ladder; and selectively coupling, using a second set of switches, resistors of a second set of resistive elements of a second resistor ladder into a resistive path between a high reference voltage and the top node of the first resistor ladder or into a resistive path between the bottom node of the first resistor ladder and a low reference voltage based on a value of the second set of inputs, wherein the second set of resistive elements and at least one of the second set of switches are arranged in an alternating series.

12. The method of claim 11 wherein resistive elements of the second set of resistive elements that are selectively switched out of the resistive path between the high reference voltage and the top node of the first resistor ladder are switched into the resistive path between the bottom node of the first resistor ladder and the low reference voltage.

13. The method of claim 11 wherein resistive elements of the second set of resistive elements that are selectively switched out of the resistive path between the bottom node of the first resistor ladder and the low reference voltage are switched into the resistive path between the high reference voltage and the top node of the first resistor ladder.

14. The method of claim 11 wherein the first set of inputs comprises a set of M most-significant-bits (MSBs) of an input digital code word and the second set of inputs comprises a set of N least-significant bits (LSBs) of the input digital code word.

15. The method of claim 14 wherein the first set of resistive elements comprise a resistance value R and the second set of resistive elements comprise a resistance value $R/2^N$, where N is equal to the number of LSBs in the input digital code word.

16. The method of claim 14 wherein the set of M MSBs of the input digital code word is coupled with the first set of switches and the set of N LSBs of the input digital code word is coupled with the second set of switches.

17. The method of claim 11 wherein the first set of switches is controlled by the value of the first set of inputs and the second set of switches is controlled by the value of the second set of inputs.

18. The method of claim 11 wherein a voltage level at the output node of the DAC circuit equals a sum of voltage levels of nodes of the first set of nodes that have been selectively coupled with the output node.

19. A circuit comprising:

means for selectively coupling, using a first set of switches, a first set of nodes of a first set of resistive elements of a first resistor ladder with an output node of a digital-to-analog converter ("DAC") circuit based on a value of the first set of inputs, wherein the first set of resistive elements are connected in series between a top node and a bottom node of the first resistor ladder; and means for selectively coupling, using a second set of switches, resistors of a second set of resistive elements of a second resistor ladder into a resistive path between a high reference voltage and the top node of the first resistor ladder or into a resistive path between the bottom node of the first resistor ladder and a low reference voltage based on a value of the second set of inputs, wherein the second set of resistive elements and at least one of the second set of switches are arranged in an alternating series.

20. The circuit of claim 19 wherein:

resistive elements of the second set of resistive elements that are selectively switched out of the resistive path between the high reference voltage and the top node of the first resistor ladder are switched into the resistive path between the bottom node of the first resistor ladder and the low reference voltage; and resistive elements of the second set of resistive elements that are selectively switched out of the resistive path between the bottom node of the first resistor ladder and the low reference voltage are switched into the resistive path between the high reference voltage and the top node of the first resistor ladder.

21. The circuit of claim 19 wherein the first set of switches is controlled by the value of the first set of inputs and the second set of switches is controlled by the value of the second set of inputs.

22. The circuit of claim 19 wherein a voltage level at the output node equals a sum of voltage levels of nodes of the first set of nodes that have been selectively coupled with the output node.

23. The circuit of claim 22 wherein the voltage levels of the nodes of the first set of nodes of the first resistor ladder are based on a number of the second set of resistors that are switched into the resistive path above the top node of the first resistor ladder and below the bottom node of the first resistor ladder.

* * * * *